(12) United States Patent
Jomaa et al.

(10) Patent No.: US 7,538,021 B2
(45) Date of Patent: May 26, 2009

(54) REMOVING DRY FILM RESIST RESIDUES USING HYDROLYZABLE MEMBRANES

(75) Inventors: Houssam Jomaa, Chandler, AZ (US); Omar Bchir, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 428 days.

(21) Appl. No.: 11/524,859

(22) Filed: Sep. 20, 2006

(65) Prior Publication Data
US 2008/0070329 A1 Mar. 20, 2008

(51) Int. Cl.
*H01L 21/44* (2006.01)
*H01L 23/52* (2006.01)
*H01L 23/48* (2006.01)
*H01L 23/40* (2006.01)
*H01L 23/485* (2006.01)
*H01L 23/488* (2006.01)

(52) U.S. Cl. .................. 438/613; 438/612; 257/780; 257/779; 257/E23.021; 257/E23.023

(58) Field of Classification Search ............... 438/612, 438/613; 257/779, 780, E23.021, E23.023
See application file for complete search history.

(56) References Cited

U.S. PATENT DOCUMENTS 6,617,674 B2 * 9/2003 Becker et al. ............... 257/678
6,709,988 B2 * 3/2004 Sakayori et al. ............ 438/745
7,122,897 B2 * 10/2006 Aiba et al. .................. 257/738

OTHER PUBLICATIONS

Gero Decher, "Fuzzy Nanoassemblies: Toward Layered Polymeric Multicomposites", Science, vol. 277, Aug. 29, 1997, pp. 1232-1237.
Joseph B. Schlenoff, et al., "Mechanism of Polyelectrolyte Multilayer Growth: Charge Overcompensation and Distribution", Macomolecules, 2001, vol. 34, pp. 592-598.
Stephen T. Dubas, et al., "Factors Controlling the Growth of Polyelectrolyte Multilayers", Macromolecules, 1999, vol. 32, pp. 8153-8160.
Eric Hubsch, et als., "Controlling the Growth Regime of Polyelectrolyte Multilayer Films: Changing from Exponential to Linear Growth by Adjusting the Composition of Polyelectrolyte Mixtures", Langmuir, 2004, vol. 20, pp. 1980-1985.
Stephen T. Dubas, et al., "Polyelectrolyte Multilayers Containing a Weak Polyacid: Construction and Destruction", Macromolecules, 2001, vol. 34, pp. 3736-3740.
Tarek Farhat, et als., "Water and Ion Pairing in Polyelectrolyte Multilayers", Langmuir, 1999, vol. 15, pp. 6621-6623.
C.G. Overberger, et al., "The Esterolyitic Activity of Poly(N-alkylimidazoles) in Ethanol-Water. The Poly(1-methyl-5-vinylimidazole)-Catalyzed Hydrolysis of p-Nitrophenyl Acetate and 3-Nitor-4-acetoxybenzoic Acid", Macromolecules, vol. 8, No. 4, Jul.-Aug. 1975, pp. 401-406.

(Continued)

*Primary Examiner*—Luan C Thai
(74) *Attorney, Agent, or Firm*—Blakely, Sokoloff, Taylor & Zafman LLP

(57) ABSTRACT

A technique to remove dry film resist residues during solder bump formation. A resist assembly is formed on a metal pad on a substrate. The resist assembly includes a solder resist (SR) layer, a poly-electrolyte multi-layer (PEMU), and a dry film resist (DFR). A SR opening is formed in the resist assembly. A solder bump is formed on the SR opening. The PEMU is removed.

11 Claims, 7 Drawing Sheets

OTHER PUBLICATIONS

Hassan H. Rmaile, et al., "Internal pKa's' in Polyelectrolyte Multilayers: Coupling Protons and Salt", Langmuir, vol. 18, No. 22, Oct. 22, 2002, pp. 8263-8265.

Joseph B. Schlenoff, et als., "Sprayed Polyelectrolyte Multilayers", Langmuir, 2000, vol. 16, pp. 9968-9969.

Eduardo Vasquez, et als., "Construction of Hydrolytically-Degradable Thin Films via Layer-by-layer Deposition of Degradable Polyelectrolytes", J.Am. Chem. Soc., 2002, vol. 124, pp. 13992-13993.

* cited by examiner

REMOVING DRY FILM RESIST RESIDUES USING HYDROLYZABLE MEMBRANES

BACKGROUND

1. Field of the Invention

Embodiments of the invention relate to the field of semiconductor, and more specifically, to semiconductor packaging.

2. Description of Related Art

Advanced flip chip packaging technologies have been actively developed in recent years to meet the requirements for high performance and reduced form factor in a variety of applications such as consumer and wireless products. One phase in a typical packaging process is the formation of contacts or interconnects such as solder balls or bumps on the substrate.

Existing methods for substrate bumping have a number of drawbacks. One technique uses a stencil and a squeegee to apply the solder paste. This technique often causes solder past lift-off with the stencil when the solder resist openings are small, leaving foreign material on the solder resist, as well as creating other alignment issues. Another technique uses disposable mask technology to enable solder paste printing. In this technique, a dry film resist (DFR) mask is used as a sacrificial stencil layer on top of the SR. This DFR mask replaces the typical metal stencil for solder paste printing and burns away during the solder reflow process. However, there may be DFR residues left over on the SR surface. Failure to completely remove the residues may lead to contamination, yield loss, problems in test and assembly, reliability, and undesirable performance issues at the bump side, such as epoxy underfill delamination.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to remove dry film resist residues during solder bump formation. A resist assembly is formed on a metal pad on a substrate. The resist assembly includes a solder resist (SR) layer, a poly-electrolyte multi-layer (PEMU), and a dry film resist (DFR). An SR opening is formed in the resist assembly. A solder bump is formed on the SR opening. The reflow process during the formation of the solder bump causes decomposition of the DFR. The PEMU is removed together with any DFR residue left after the DFR decomposition.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention is a technique to form solder bumps on a substrate and remove completely DFR residue. In conventional techniques, the DFR residues may be left on the SR layer after using a disposable mask for solder pasting. An embodiment of the invention uses a hydrolyzable poly-electrolyte multi-layers (PEMU) membrane under the DFR to assist the DFR removal, eliminating DFR residue on the SR surface. The PEMU may be a separating membrane between the SR layer and the DFR. After solder reflow, the DFR may be burned off or decomposed. The DFR residues may be left over on the PEMU. The PEMU may be removed or dissolved together with the DFR residues by dissolution in a wet bath using a high pH stripping solution. The PEMU may be formed by alternately deposited multiple layers, or membranes, of oppositely charged poly-electrolytes having a desired number of layers. In one embodiment, the oppositely charged poly-electrolytes are poly(vinylimidazole) (PVI) and poly(styrene sulfonate) (PSS). Unlike the chemical reaction in which NaOH attacks the DFR membrane, the action of the base on the poly-electrolyte multilayer leads only to charge neutralization on the PVI, which in turn leads to film dissolution. Since the effect of pH on the charge of PVI is isotropic, the film dissolution is highly reproducible. The technique is therefore easy to implement, effective, and inexpensive to eliminate issues with residue leftover after DFR removal.

Figure 1:
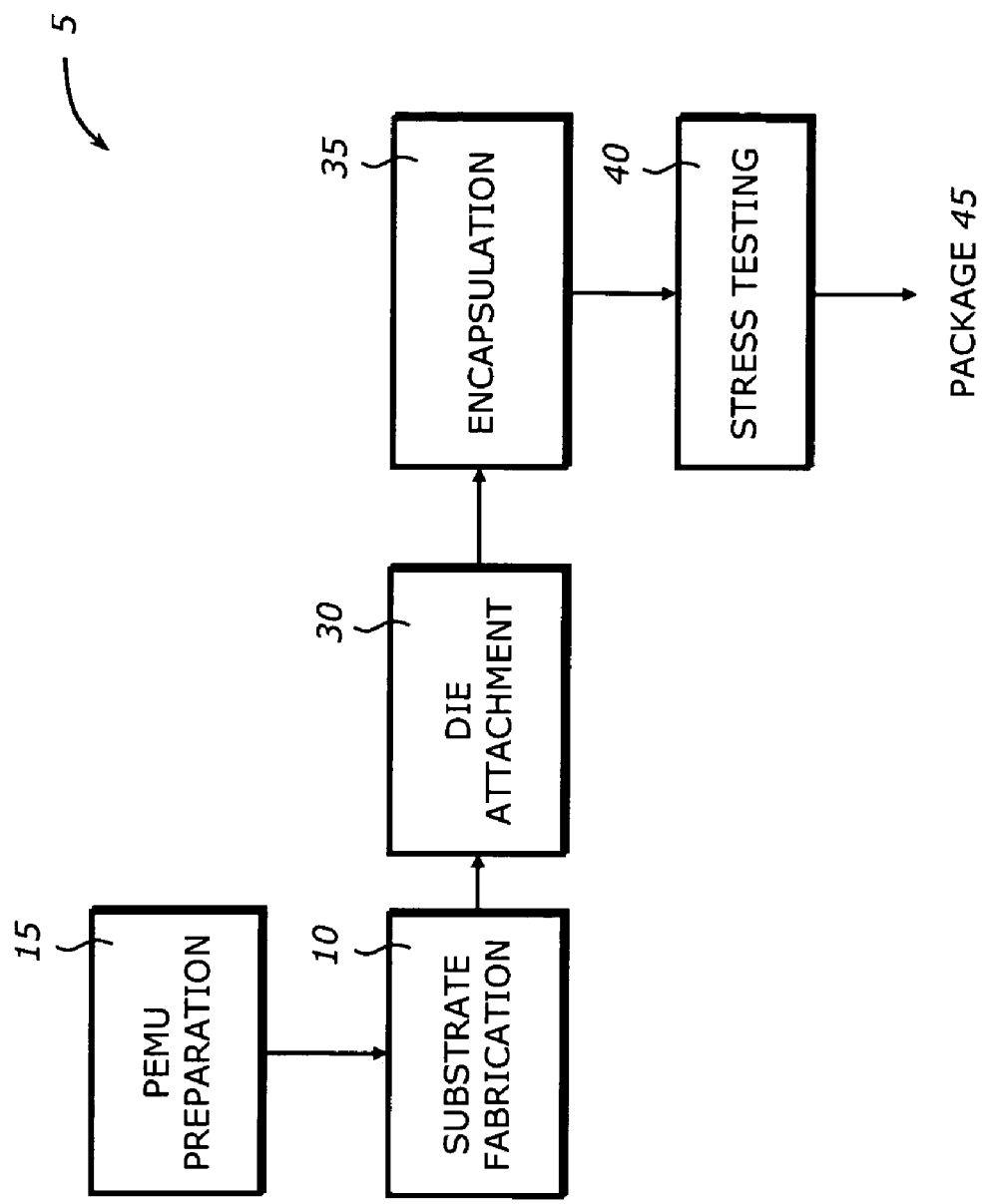
FIG. 1 is a diagram illustrating a manufacturing system in which one embodiment of the invention can be practiced.

FIG. 1 is a diagram illustrating a manufacturing system 5 in which one embodiment of the invention can be practiced. The system 5 includes a substrate fabrication phase 10, a PEMU preparation phase 15, a die attachment phase 30, an encapsulation phase 35, and a stress testing phase 40. The system 5 represents a manufacturing flow of a semiconductor packaging process.

The substrate fabrication phase 10 fabricates the substrate panel containing a number of individual substrates. The individual substrates may be used to package any microelectronic devices such as microprocessors, memory devices, interface circuits, etc. The fabrication phase 10 includes typical processes for substrate fabrication. The various metal layers in the substrate are interconnected by etching holes, called "vias," in the dielectric material. Solder bumps may be formed using a paste printing process, or others. During the formation of the solder bumps, disposable mask such as the DFR may be used. The complete removal of the DFR residues may be performed using the PEMU.

The PEMU preparation phase 15 prepares the poly-electrolyte solutions to be used in forming the PEMU in the resist assembly to be deposited on the substrate. By varying the poly-electrolyte solution properties such as salt concentration and pH, the thickness, structure, and morphology of the PEMU may be properly controlled.

The die attachment phase 30 attaches the die to a package substrate. The substrate material depends on the packaging type. It may be lead-frame, plastic, or epoxy. The substrate is fabricated to have a reduced layer count by using an external ground layer. The external ground layer may be a conductive layer, such as a copper foil, that is surface mounted on the substrate. Wire bonding may be performed to interconnect wires connecting the bond pads on the die or dice to the substrate.

The encapsulation phase 35 encapsulates the die and the substrate. Depending on the packaging type, this may include molding, wire bonding, and solder ball attachment. Underfill material may be dispensed between the die and the substrate. Integrated heat spreader (IHS) may be attached to the die and substrate assembly. The encapsulated assembly of the die and substrate becomes a package 45 ready to be tested.

The stress testing phase 40 performs one or more tests such as Highly Accelerated Stress Test (HAST) or biased-HAST on the device package under stress conditions. A test chamber may be designed to conduct a stress test. It may have monitoring circuits, measurement circuits, and other data processing equipment. The package 45 is placed in the test chamber subject to the stress test. It may be powered or non-powered. Various stress tests may be performed on the wafer or on the packaged devices 45 at various points of the manufacturing process flow. The tests may follow standards such as Joint Electron Device Engineering Council (JEDEC) standards or military standards. Examples of these tests may include electrostatic discharge (ESD), or human body model (HBM), high temperature operational life (HTOL), thermal shock, temperature cycle, high temperature storage, vibration and mechanical loading, shear testing, and accelerated moisture resistance.

Figure 2A:
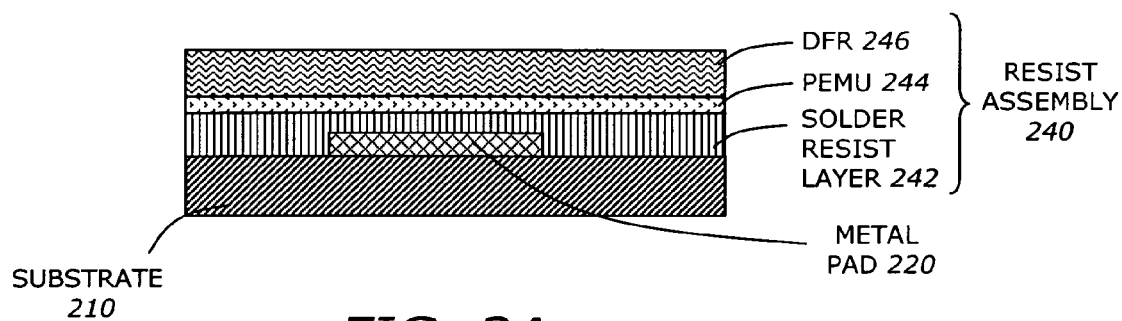
FIG. 2A is a diagram illustrating forming a resist assembly on a substrate panel according to one embodiment of the invention.

FIG. 2A is a diagram illustrating forming a resist assembly on a substrate according to one embodiment of the invention.

A metal pad 220 is formed on a substrate 210. It may be made of a suitable metal, such as copper. Then, a resist assembly 240 is formed on the metal pad 220 and covers the substrate 210.

The resist assembly 240 includes a solder resist (SR) layer 242, a poly-electrolyte multi-layer (PEMU) 244, and a dry film resist (DFR) 246. The SR layer 242 may be made of any resist material such as epoxy. The PEMU 244 may have a desired thickness or a desired number of layers or membranes. The PEMU 244 may include alternately deposited multiple layers, or membranes, of oppositely charged poly-electrolytes having a desired number of layers. The PEMU 244 is sensitive to a high pH solution to dissolve the membranes. In one embodiment, the oppositely charged poly-electrolytes are poly(vinylimidazole) (PVI) and poly(styrene sulfonate) (PSS). When the pH is elevated, the imidazole becomes unprotonated and hence loses its charge, leading to dissolution of the membranes. The buildup of the multi-layers in the PEMU 244 may be performed by dipping or spraying. Spraying the poly-electrolytes solutions alternately with rinses in between may be more efficient than dipping.

Figure 2B:
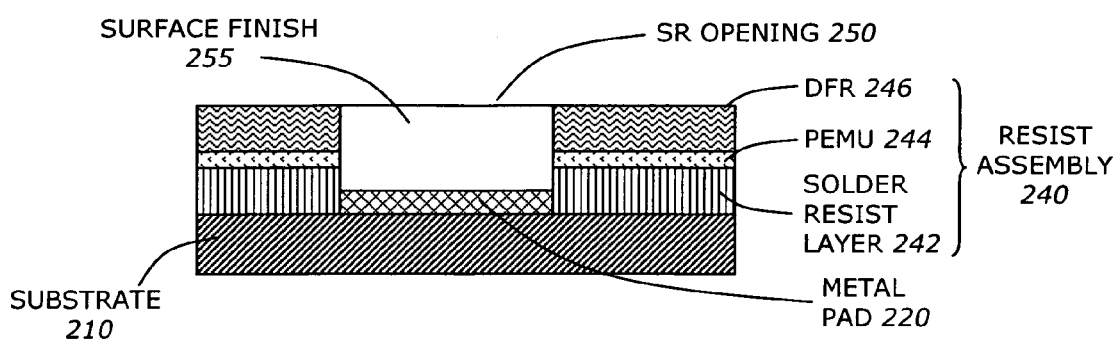
FIG. 2B is a diagram illustrating applying a surface finish to an SR opening according to one embodiment of the invention.

FIG. 2B is a diagram illustrating applying a surface finish to an SR opening according to one embodiment of the invention.

The SR layer 242 and the DFR 246 are exposed and developed at the same time to form an SR opening 250. Then, a surface finish 255 is deposited on the SR opening 250. The surface finish 255 ensures solderability. In one embodiment, the surface finish 255 may be one of Electroless Nickel/Immersion Gold (ENIG), Electrolytic Nickel/Gold (EG), and Nickel-Palladium-Gold (NiPdAu), any combination of them, or any other suitable type. The ENIG process deposits nickel via an electroless process where electrons are generated by a reducing agent and deposits gold using electrons from the nickel surface. The EG process uses plating technology to deposit both nickel and gold. Electrons are generated via rectification and reduce the cations in solution, driving the deposition of both nickel and gold on the surface. Adequate amounts of nickel and gold are deposited to provide a barrier to copper migration, protect the nickel from oxidation, stabilized the plated through hole and provide a coplanar surface.

The surface finish 255 provides a solder wettable surface for the bump, where the bump may form strong intermetallic bonds. The surface finish 255 prevents the solder from diffusing through the material, leading to dewetting from the metal pad 220.

Figure 2C:
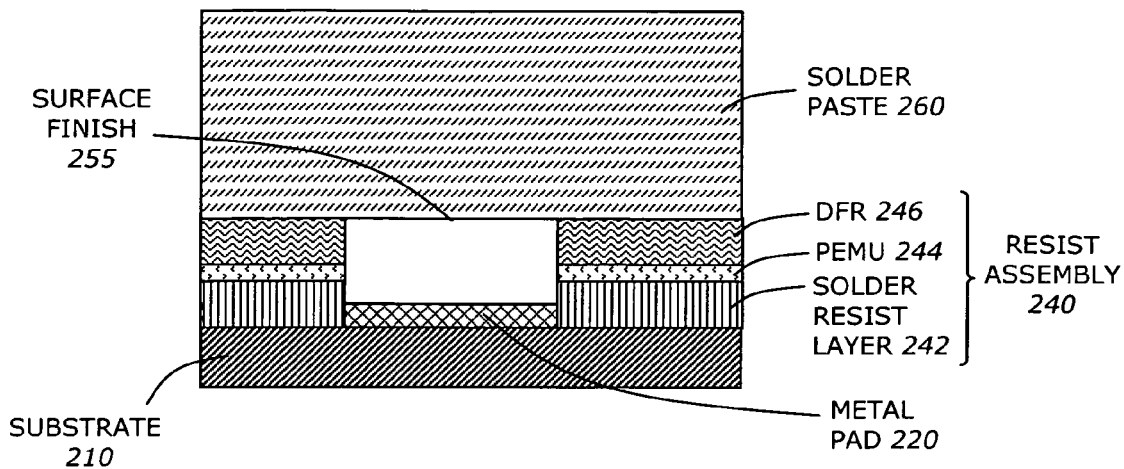
FIG. 2C is a diagram illustrating depositing a solder paste on the surface finish according to one embodiment of the invention.

FIG. 2C is a diagram illustrating depositing a solder paste on the surface finish according to one embodiment of the invention.

A solder paste 260 may be deposited on the surface finish 255 and the resist assembly 240. This may be performed by solder paste printing. The solder paste factors such as particle size, distribution, viscosity, flux vehicle, slump characteristic, and metal content may be selected according to the desired bump requirements (e.g., reproducible precision). The solder paste 260 may be high lead 90Pb/10Sn, eutectic 63Sn/37Pb, or lead free 95.5Sn/3.8Ag/0.7Cu. The solder paste 260 together with the surface finish 255, the resist assembly 240, the metal pad 220, the substrate and the die form a solder bump assembly ready for reflow.

Figure 2D:
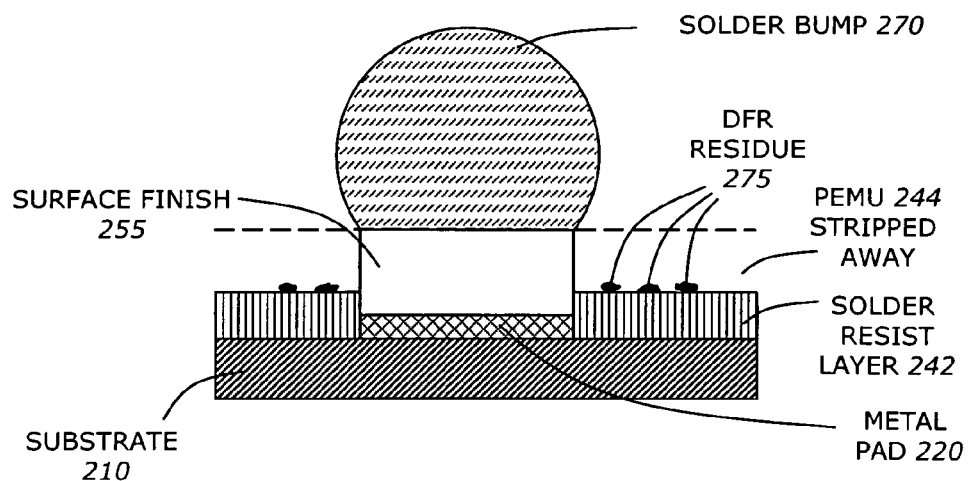
FIG. 2D is a diagram illustrating forming a solder bump according to one embodiment of the invention.

FIG. 2D is a diagram illustrating forming a solder bump according to one embodiment of the invention.

The solder paste 260 is then reflowed at a reflow temperature according to the type of the solder paste. For example, for the 63Sn/37PB, the reflow temperature is approximately 210° C. The 90Pb/10Sn solder paste may need a reflow temperature at about 330° C. The reflow temperature is typically high enough to cause decomposition of the DFR 246, but is much lower than the temperature to decompose the PEMU. Any DFR residue 275 may be left on the PEMU 244. Subsequently, the PEMU 244 is stripped away by a high pH stripping solution. The PEMU 244 is removed together with any left-over DRF residue, leaving a clean surface on the SR layer 242.

Figure 3:
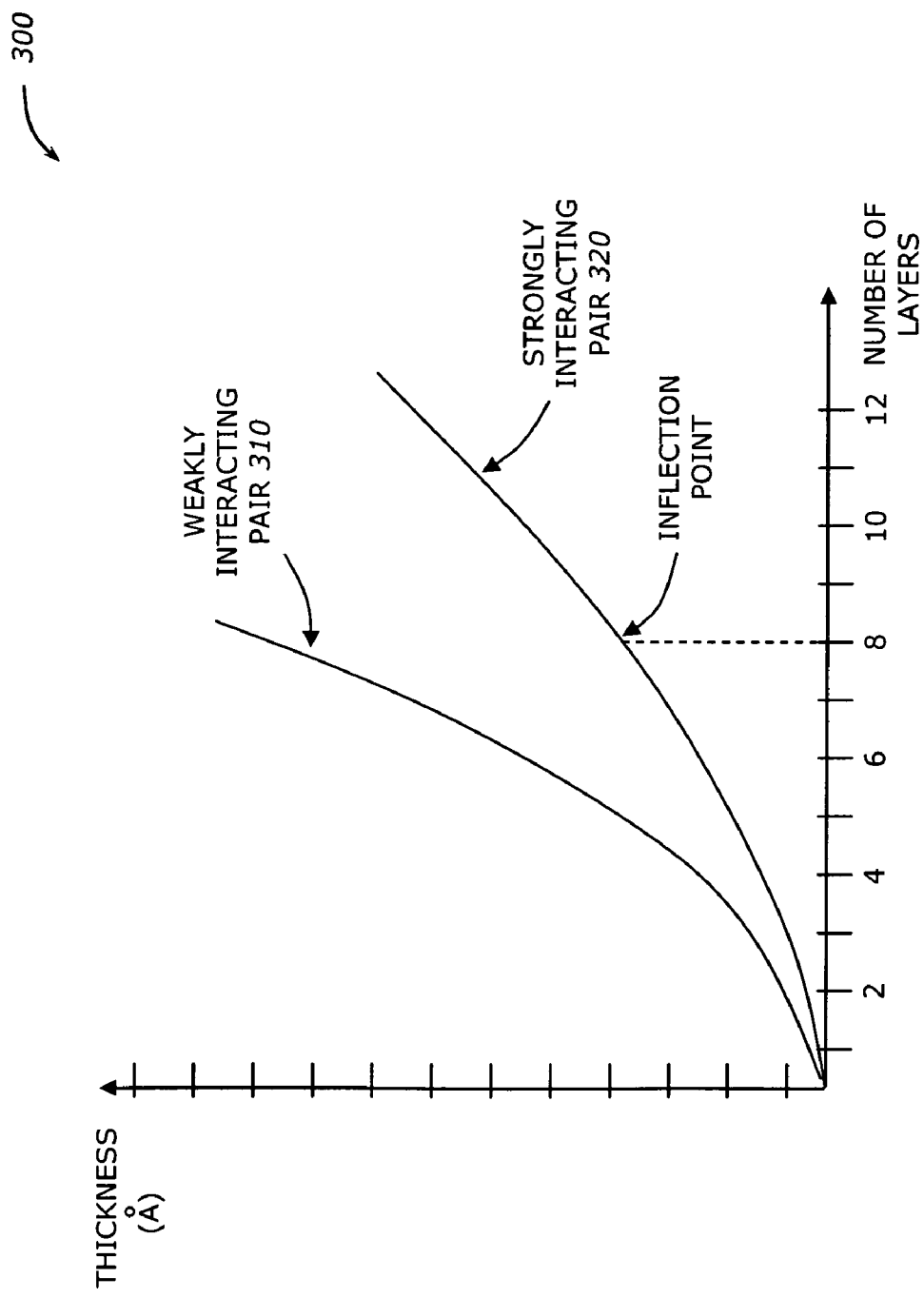
FIG. 3 is a diagram illustrating relationship between thickness and number of layers of the PEMU according to one embodiment of the invention.

FIG. 3 is a diagram illustrating relationship between thickness and number of layers of the PEMU according to one embodiment of the invention. The relationship between the thickness of the PEMU and the number of layers depends on the type of interaction between the poly-electrolytes. Two basic types are shown in curves 310 and 320.

The curve 310 shows the relationship between the thickness of the PEMU and the number of layers of weakly interacting pair of poly-electrolytes, such as poly-acids and poly-bases. The curve 310 shows a semi-exponential relationship.

As the number of layers increases, the thickness increases very fast, almost exponentially.

The curve 320 shows the relationship between the thickness of the PEMU and the number of layers of moderately interacting pair of poly-electrolytes, such as the quaternary ammonium and sulfonates. The curve 320 shows a somewhat linear relationship. As the number of layers increases, the thickness increases slowly, almost linearly. Examples of the moderately interacting pair are PVI and PSS. For a thickness of approximately 1 µm, the number of layers may be approximately 20. For a thickness of approximately 5 µm, the number of layers may be approximately 50.

The desired thickness for the PEMU provides a spacer distance between the solder resist layer and the DFR.

Figure 4:
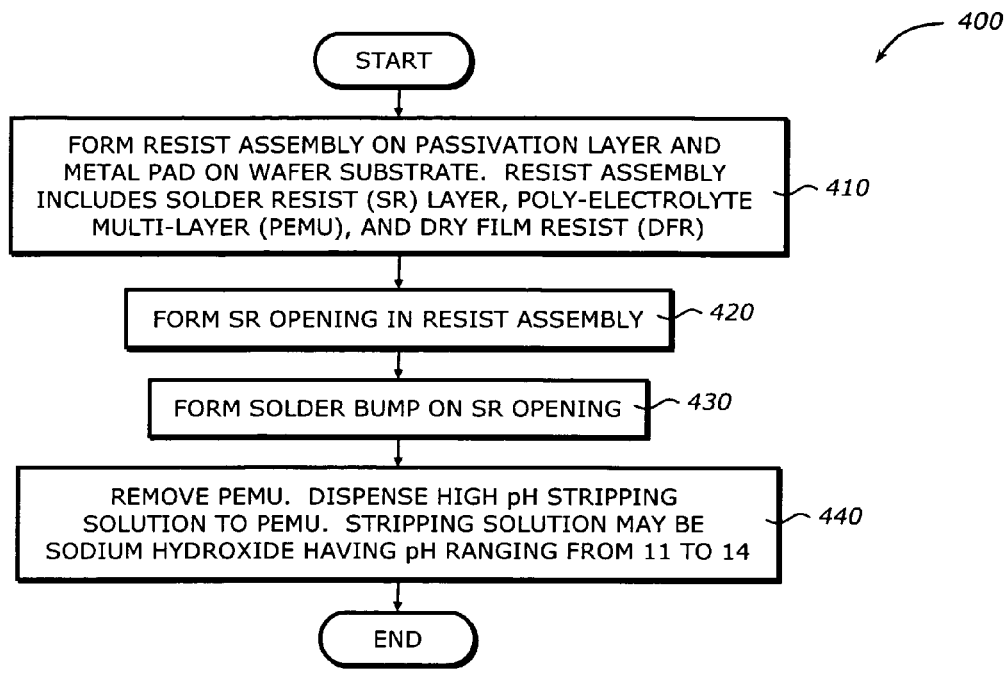
FIG. 4 is a flowchart illustrating a process to remove DFR in bump formation according to one embodiment of the invention.

FIG. 4 is a flowchart illustrating a process 400 to remove DFR in bump formation according to one embodiment of the invention.

Upon START, the process 400 forms a resist assembly on a substrate and a metal pad on a wafer substrate (Block 410). The resist assembly includes solder resist (SR) layer, a poly-electrolyte multi-layer (PEMU), and a dry film resist (DFR). Then, the process 400 forms an SR opening in the resist assembly (Block 420). Next, the process 400 forms a solder bump on the SR opening (Block 430).

Then, the process 400 removes the PEMU (Block 440). This may be performed by dispensing a high pH stripping solution to the PEMU. An example of such a stripping solution is a sodium hydroxide solution having a pH ranging from 11 to 14. The removal of the PEMU also removes any DFR residues left after decomposition. This removal therefore leads to a clean SR surface. The process 400 is then terminated.

Figure 5:
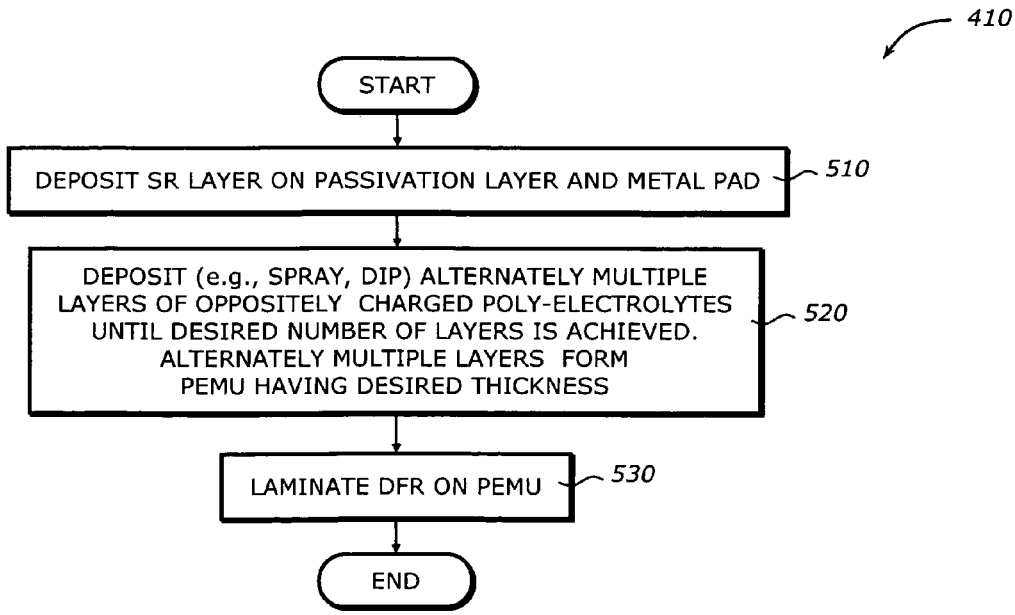
FIG. 5 is a flowchart illustrating a process to form a resist assembly according to one embodiment of the invention.

FIG. 5 is a flowchart illustrating the process 410 shown in FIG. 4 to form the resist assembly according to one embodiment of the invention.

Upon START, the process 410 deposits the SR layer on the passivation layer and the metal pad (Block 510). The SR layer may be either rolled on as a dry film or curtain-coated as a liquid. The SR layer may be cured by a half bake. Next, the process 410 forms the PEMU by depositing alternately multiple layers of oppositely charged poly-electrolytes until a desired number of layers is achieved (Block 520). This may be performed by spraying or dipping. The alternately multiple layers form the PEMU having a desired thickness. The desired thickness and the desired number of layers are related according to the type of the pair of poly-electrolytes as illustrated in FIG. 3. In one embodiment, the desired thickness may range from approximately 1 µm to about 5 µm, and the desired number of layers may range from approximately 10 to about 75.

Then, the process 410 laminates the DFR on the PEMU (Block 530). The process 410 is then terminated.

Figure 6:
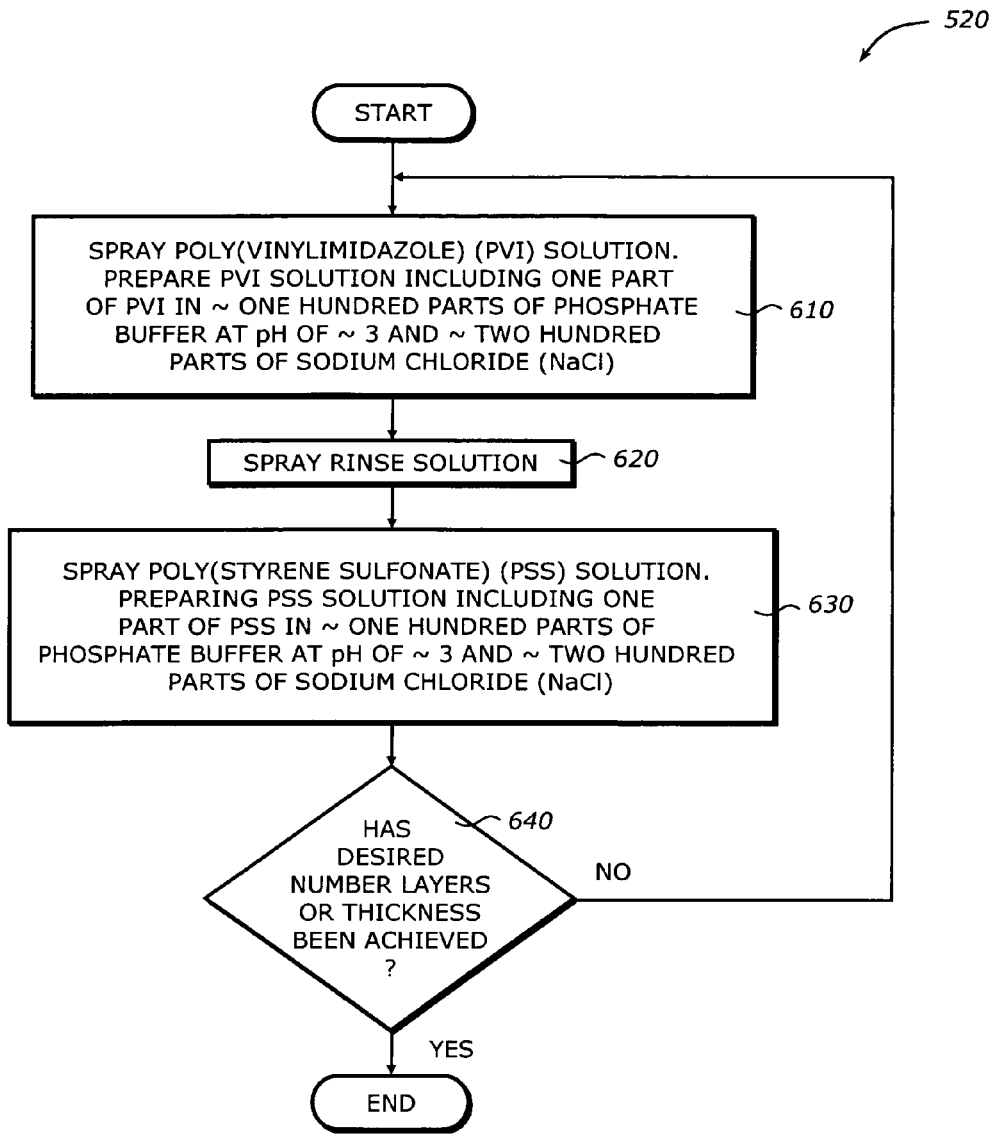
FIG. 6 is a flowchart illustrating a process to deposit alternately multiple layers according to one embodiment of the invention.

FIG. 6 is a flowchart illustrating the process 520 shown in FIG. 5 to deposit alternately multiple layers according to one embodiment of the invention.

Upon START, the process 520 dips the SR panel in a PVI solution, or sprays a PVI solution on a panel (e.g., SR layer) or the preceding PSS layer to form a PVI layer (Block 610). The PVI solution may be prepared to include one part of PVI in approximately one hundred parts of phosphate buffer at a pH of approximately 3 and approximately two hundred parts of sodium chloride (NaCl). For example, the PVI solution may include 1 mM PVI in about 100 mM phosphate buffer at pH 3 and 0.2M NaCl.

Then, the process 520 dips the SR panel in, or sprays, a rinse solution to the SR panel to remove any loose poly-electrolytes (Block 620). The rinse solution may be the same as the PVI solution without the polymer. Usually, the rinse spraying is done three times as much as the polymer spraying to insure removal of all loose poly-electrolytes.

Next, the process 520 dips the SR panel in, or sprays, a PSS solution on the PVI layer to form a PSS layer (Block 630). The PSS solution may be prepared in a similar manner as the PVI solution. In other words, it may include one part of PSS in approximately one hundred parts of phosphate buffer at a pH of approximately 3 and approximately two hundred parts of sodium chloride (NaCl). For example, the PSS solution may include 1 mM PSS in about 100 mM phosphate buffer at pH 3 and 0.2M NaCl.

Then, the process 520 determines if the desire number of layers or the desired thickness has been achieved (Block 640). If not, the process 520 returns to Block 610 to continue generating a pair of layers of PVI and PSS. Otherwise, the process 520 is terminated.

Figure 7:
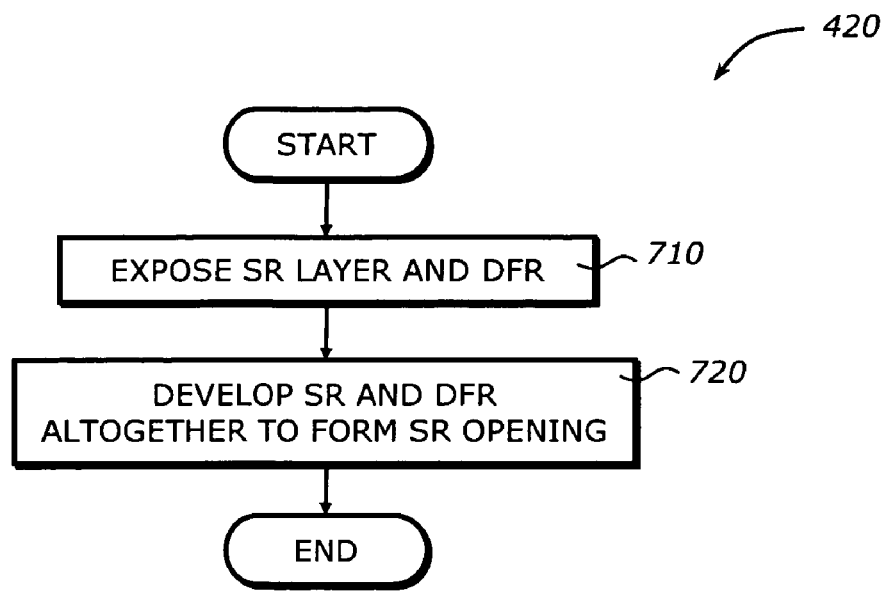
FIG. 7 is a flowchart illustrating a process to form an SR opening according to one embodiment of the invention.

FIG. 7 is a flowchart illustrating the process 420 shown in FIG. 4 to form an SR opening according to one embodiment of the invention.

Upon START, the process 420 exposes the SR layer and the DFR (Block 710). Then, the process 420 develops the SR and the DFR (Block 720). The development of the SR and the DFR forms the SR opening. Since the development removes both the DFR and the SR from the unexposed areas, there are no extra steps required to remove the PEMU from the bump area. This is because any PEMU in this area is removed when the SR is removed. The DFR and SR may be developed by carrying out in a solution of $Na_2CO_3$ at a concentration of approximately 10 grams/liter (g/l). This concentration translates to 0.1 mol/liter, which is insufficient to cause any dissolution or destruction of the PEMU. From the standpoint of pH, the developer solution's pH is close to neutral which also has no effect on the PEMU. Furthermore, the possibility of undercut in the PEMU is very low because the formed SR openings are on the order of microns and the polymer chains constituting the membranes have a much smaller radius of gyration. The process 420 is then terminated.

Figure 8:
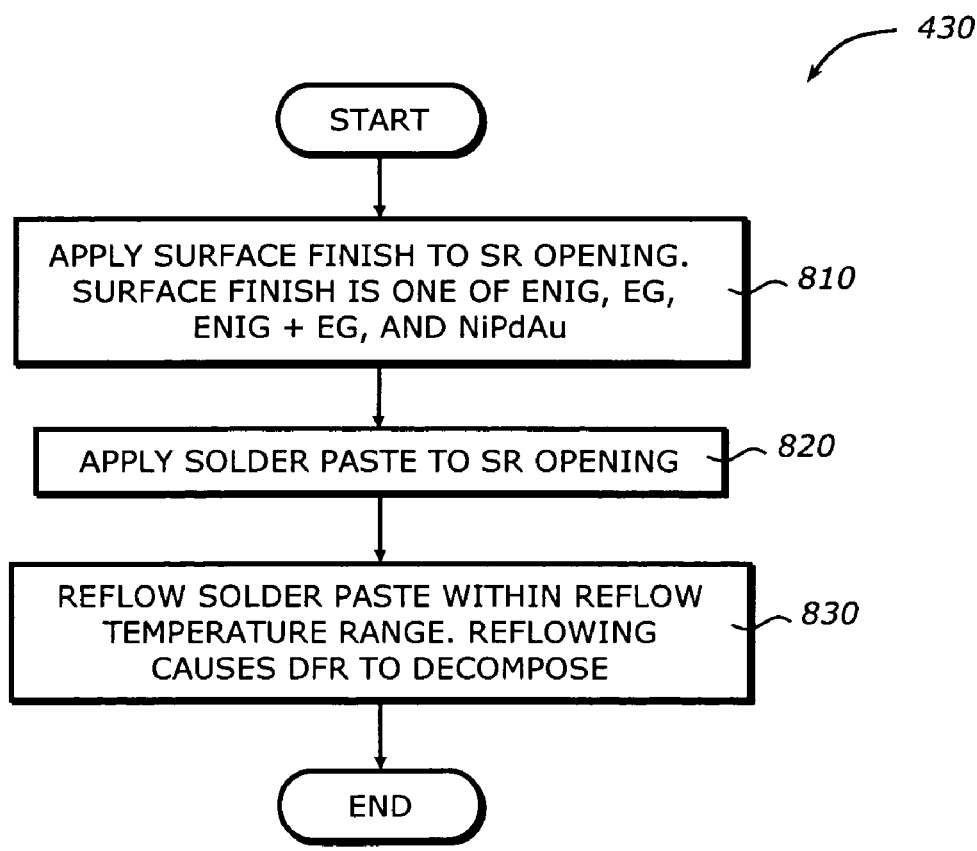
FIG. 8 is a flowchart illustrating a process to form a solder bump according to one embodiment of the invention.

FIG. 8 is a flowchart illustrating the process 430 shown in FIG. 4 to form a solder bump according to one embodiment of the invention.

Upon START, the process 430 applies a surface finish to the SR opening (Block 810). The surface finish essentially forms the soldering surface on the substrate. It may be one of ENIG, EG, and NiPdAu or any combination thereof. The PEMU is able to withstand the surface finish plating processes due to the low pH. For example, the pH ranges for NiPdAu going from neutral pH for Pd and Au to a low pH of approximately 4 to 5 for Ni plating.

Next, the process 430 applies a solder paste to the SR opening (Block 820). The solder paste is deposited on the surface finish. It may be made of any suitable solder paste material, such as high lead 90Pb/10Sn, eutectic 63Sn/37Pb, or lead free 95.5Sn/3.8Ag/0.7Cu.

Then, the process 430 reflows the solder paste within a reflow temperature range (Block 830). This reflow temperature range may be approximately from 210° C. to 250° C., which is much lower than the temperature at which the PEMU may be decomposed. The PEMU may be decomposed at approximately 400° C. The reflowing causes the DFR to decompose or burn off. The process 430 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   forming a resist assembly on a metal pad on a substrate, the resist assembly including a solder resist (SR) layer, a poly-electrolyte multi-layer (PEMU), and a dry film resist (DFR);
   forming an SR opening in the resist assembly;
   forming a solder bump on the SR opening; and
   removing the PEMU.

2. The method of claim 1 wherein forming the resist assembly comprises:
   depositing the SR layer on the metal pad;
   depositing alternately multiple layers of oppositely charged poly-electrolytes until a desired number of layers is achieved, the alternately multiple layers forming the PEMU having a desired thickness; and
   laminating the DFR on the PEMU.

3. The method of claim 2 wherein depositing alternately multiple layers comprises:
   dipping in, or spraying, a poly(vinylimidazole) (PVI) solution;
   dipping in, or spraying, a rinse solution; and
   dipping in, or spraying, a poly(styrene sulfonate) (PSS) solution.

4. The method of claim 1 wherein forming the SR opening comprises:
   exposing the SR layer and the DFR; and
   developing the SR and the DFR.

5. The method of claim 1 wherein forming the solder bump comprises:
   applying a surface finish to the SR opening, the surface finish being one of Electroless Nickel/Immersion Gold (ENIG), Electrolytic Nickel/Gold (EG), and Nickel-Palladium-Gold (NiPdAu);
   apply solder paste on the surface finish; and
   reflowing the solder paste within a reflow temperature range, the reflowing causing the DFR to decompose.

6. The method of claim 1 wherein removing the PEMU comprises:
   dispensing a high pH stripping solution to the PEMU.

7. The method of claim 1 wherein the desired thickness ranges from approximately 1 μm to 5 μm.

8. The method of claim 2 wherein the desired number of layers ranges from approximately 10 to 75.

9. The method of claim 3 wherein dipping in, or spraying, the PVI solution comprises:
   preparing the PVI solution including one part of PVI in approximately one hundred parts of phosphate buffer at a pH of approximately 3 and approximately two hundred parts of sodium chloride (NaCl).

10. The method of claim 3 wherein dipping in, or spraying, the PSS solution comprises:
    preparing the PSS solution including one part of PSS in approximately one hundred parts of phosphate buffer at a pH of approximately 3 and approximately two hundred parts of sodium chloride (NaCl).

11. The method of claim 4 wherein dispensing a high pH stripping solution comprises:
    dispensing a sodium hydroxide solution having a pH ranging from 11 to 14.

\* \* \* \* \*